(12) United States Patent
Okuta et al.

(10) Patent No.: US 11,971,431 B2
(45) Date of Patent: Apr. 30, 2024

(54) OPTICAL PROBE, OPTICAL PROBE ARRAY, OPTICAL PROBE CARD, AND METHOD OF MANUFACTURING OPTICAL PROBE

(71) Applicant: Kabushiki Kaisha Nihon Micronics, Tokyo (JP)

(72) Inventors: Michitaka Okuta, Kanagawa (JP); Yuki Saito, Saitama (JP); Jukiya Fukushi, Aomori (JP); Shou Harako, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 449 days.

(21) Appl. No.: 17/324,740

(22) Filed: May 19, 2021

(65) Prior Publication Data
US 2021/0364552 A1   Nov. 25, 2021

(30) Foreign Application Priority Data

May 20, 2020 (JP) .................................. 2020-088168

(51) Int. Cl.
*G02B 6/42* (2006.01)
*G01R 1/073* (2006.01)
*G01R 31/26* (2020.01)
*G02B 6/26* (2006.01)

(52) U.S. Cl.
CPC ......... *G01R 1/07342* (2013.01); *G01R 31/26* (2013.01); *G02B 6/4203* (2013.01); *G02B 6/262* (2013.01)

(58) Field of Classification Search
None
See application file for complete search history.

(56) References Cited

U.S. PATENT DOCUMENTS

| | | | |
|---|---|---|---|
| 5,011,254 A * | 4/1991 | Edwards | G02B 6/4203 385/33 |
| 5,751,871 A * | 5/1998 | Krivoshlykov | G02B 6/4203 385/38 |
| 7,184,623 B2 * | 2/2007 | Cai | G02B 6/2552 359/333 |
| 7,184,626 B1 | 2/2007 | Gunn, III et al. | |
| 7,262,852 B1 * | 8/2007 | Gunn, III | G02B 6/29311 250/559.4 |

(Continued)

FOREIGN PATENT DOCUMENTS

| | | | |
|---|---|---|---|
| CN | 105193379 A * | 12/2015 | ............... A61B 3/14 |
| CN | 105193379 A | 12/2015 | |

(Continued)

*Primary Examiner* — Omar R Rojas
(74) *Attorney, Agent, or Firm* — Lorenz & Kopf, LLP

(57) ABSTRACT

An optical probe includes a first region and a second region connected to have a continuous optical waveguide in which a transmission mode is a single mode. The first region connected to a tip-end surface opposed to an optical device includes a region in which a mode field diameter that is maximum at the tip-end surface is gradually decreased toward a boundary between the first region and the second region. The tip-end surface is a curved surface and has a radius of curvature set so that an advancing direction of an optical signal entering through the tip-end surface approximates in parallel to a central-axis direction of the optical waveguide.

9 Claims, 13 Drawing Sheets

(56) References Cited

U.S. PATENT DOCUMENTS

| | | | |
|---|---|---|---|
| 2004/0218867 A1 | | 11/2004 | Nakamura et al. |
| 2005/0265653 A1 | | 12/2005 | Cai et al. |
| 2006/0008226 A1 | | 1/2006 | McCann et al. |
| 2014/0308001 A1* | | 10/2014 | Lao ..................... G02B 6/4212 |
| | | | 385/33 |

FOREIGN PATENT DOCUMENTS

| | | | |
|---|---|---|---|
| JP | S59177503 A | | 10/1984 |
| JP | S6231136 A | | 2/1987 |
| JP | S63224385 A | | 9/1988 |
| JP | 2001356237 A | | 12/2001 |
| JP | 2004191632 A | * | 7/2004 |
| JP | 2004191632 A | | 7/2004 |
| JP | 2018081948 A | | 5/2018 |
| KR | 20040057912 A | | 7/2004 |

* cited by examiner

OPTICAL PROBE, OPTICAL PROBE ARRAY, OPTICAL PROBE CARD, AND METHOD OF MANUFACTURING OPTICAL PROBE

CROSS-REFERENCE TO PRIORITY APPLICATION

This application is based upon and claims the benefit of priority from prior Japanese Patent Application P2020-088168, filed on May 20, 2020; the entire contents of which are incorporated by reference herein.

TECHNICAL FIELD

Embodiments described herein relate generally to an optical probe, an optical probe array, an optical probe card, and a method of manufacturing an optical probe used for measuring an optical device.

BACKGROUND

Optical devices using input/output signals which are optical signals are formed on a wafer by use of silicon photonics. Optical probes are used to inspect the characteristics of the optical devices formed on the wafer. To reduce a loss of optical signals transmitted between the optical devices to be inspected and the optical probes, a positioning between the optical devices and the optical probes and an adjustment of a mode field are executed.

When the optical signals are transmitted in a single mode, a size of optical signal terminals of the optical devices, a core diameter of the optical probes, and a mode field diameter are as small as the order of several micrometers. Since a tolerance in the positioning between the optical signal terminals of the optical devices and tip-end surfaces of the optical probes is quite small, it is difficult to align the optical devices with the optical probes with a high accuracy. This leads to an increase in the entire measurement time due to the increase in the time required for the alignment or leads to an increase in connection loss derived from inaccurate alignment upon the measurement of the optical devices. The transmission of the optical signals in the single mode thus impedes the efficient measurement of the optical devices.

BRIEF SUMMARY

An aspect of the present disclosure provides an optical probe including a first region and a second region connected to have a continuous optical waveguide in which a transmission mode is a single mode. The first region connected to a tip-end surface opposed to an optical device includes a region in which a mode field diameter that is maximum at the tip-end surface is gradually decreased toward a boundary between the first region and the second region. The tip-end surface is a curved surface and has a radius of curvature set so that an advancing direction of an optical signal entering through the tip-end surface approximates in parallel to a central-axis direction of the optical waveguide.

DETAILED DESCRIPTION

Figure 1:
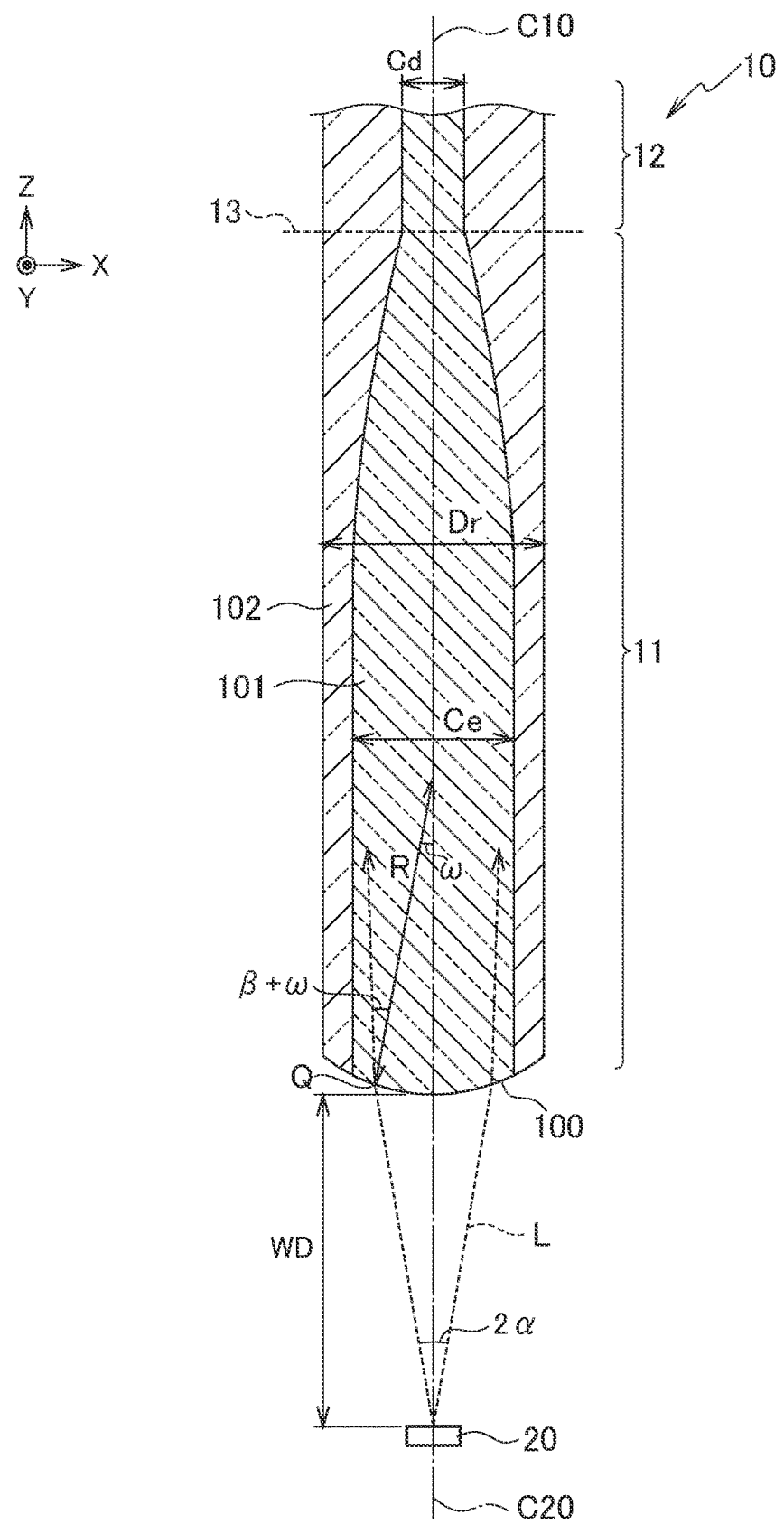
FIG. 1 is a schematic cross-sectional view illustrating a configuration of an optical probe according to a first embodiment.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this disclosure, and the embodiments of this invention do not specify materials, shapes, structures, dispositions and the like of constituent components to those described below.

First Embodiment

An optical probe 10 according to a first embodiment communicates optical signals with an optical device 20. The first embodiment is illustrated below with a case in which an optical signal L emitted from the optical device 20 to enter the optical probe 10 is further transmitted through an optical waveguide of the optical probe 10. FIG. 1 illustrates an end part of the optical probe 10 including a tip-end surface 100 to be opposed to the optical device 20 so as to allow the optical signal L to be transmitted therethrough.

A central axis C10 of the optical waveguide of the optical probe 10 illustrated in FIG. 1 is defined as a Z-axis direction, and a plane surface perpendicular to the Z-axis direction is defined as an X-Y plane. A right-left direction on the sheet of FIG. 1 is defined as an X-axis direction, and a direction perpendicular to the sheet is defined as a Y-axis direction. The X-axis direction, the Y-axis direction, and the Z-axis direction are also collectively referred to below as "X-Y-Z-axis directions".

The optical probe 10 can be an optical fiber or have a configuration in which an optical fiber and a lens are combined together. The optical probe 10 has the optical waveguide in which a transmission mode is a single mode. The optical waveguide of the optical probe 10 has a configuration in which a core part 101 is covered at a circumference with a clad part 102. A clad diameter Dr indicated in FIG. 1 corresponds to an outer diameter of the optical probe 10 including the clad part 102.

The tip-end surface 100 of the optical probe 10 is optically connected to an optical signal terminal (not illustrated) from which the optical signal L of the optical device 20 is emitted. The tip-end surface 100 is a convex surface having a radius of curvature R. The radius of curvature R is described in detail below. The optical probe 10 includes a first region 11 connected to the tip-end surface 100 and a second region 12 having a smaller core diameter than the first region 11, and has a structure in which the first region 11 and the second region 12 are integrated with or connected to each other. The optical waveguide of the first region 11 and the optical waveguide of the second region 12 are integrated with each other in FIG. 1. The first region 11 is defined in a predetermined range in the optical probe 10 from the tip-end surface 100 in the extending direction of the central axis C10 (also referred to below as a "central-axis direction") of the optical waveguide of the optical probe 10.

A mode field diameter at the tip-end surface 100 of the optical probe 10 is referred to as a "first MF diameter Ce". The first region 11 includes a region in which the mode field diameter that is maximum at the tip-end surface 100 is gradually decreased in a tapered state toward a boundary 13 between the first region 11 and the second region 12. The mode field diameter of the first region 11 conforms to the mode field diameter of the second region 12 at the boundary 13. The mode field diameter of the second region 12 is constant in the central-axis direction. The mode field diameter of the second region 12 is referred to as a "second MF diameter Cd".

Figure 2:
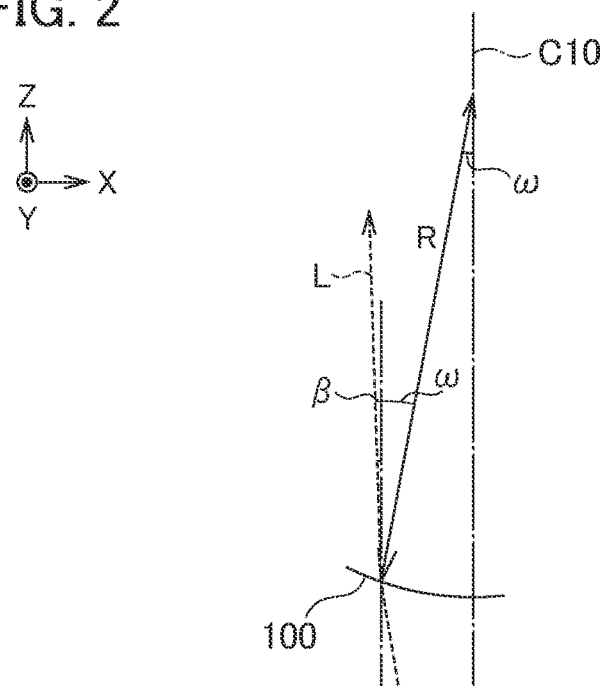
FIG. 2 is a schematic view for explaining an angle of refraction at a tip-end surface of the optical probe according to the first embodiment.

The optical signal L emitted from the optical device 20 at a radiation angle 2α enters an incident point Q on the tip-end surface 100. The optical signal L passes through the incident point Q at a central semi-angle ω while making a refraction angle (β+ω) with the direction of the radius of curvature. The angle β is defined between the advancing direction of the optical signal L passing through the tip-end surface 100 and the central-axis direction, as illustrated in FIG. 2.

The optical probe 10 is separated from the optical device 20 by an operating distance WD in the Z-axis direction. The operating distance WD is defined in a range in which the optical probe 10 can receive the optical signal L emitted from the optical device 20. In other words, the operating distance WD is defined such that the incident range of the optical signal L is set to be within the optical waveguide at the tip-end surface 100.

Figure 3:
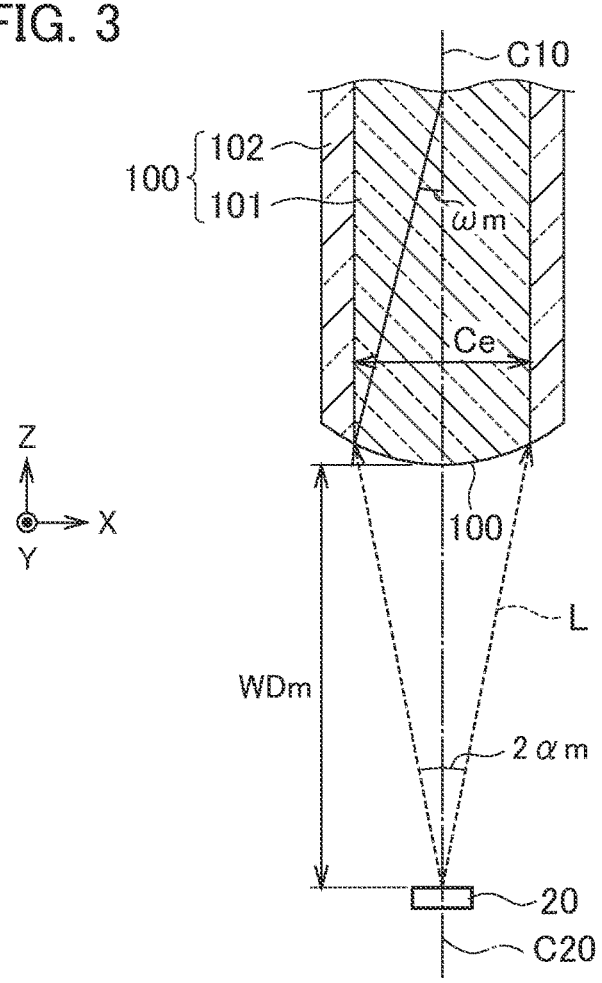
FIG. 3 is a schematic view for explaining a maximum operating distance.

FIG. 3 illustrates a state in which the distance between the optical probe 10 and the optical device 20 is an available maximum operating distance to be set (referred to below as a "maximum operating distance WDm"). The maximum radiation angle of the optical signal L in the maximum operating distance WDm is indicated by 2αm. A numerical aperture NA at the tip-end surface 100 is defined by sin(αm).

The radius of curvature R of the tip-end surface 100 of the optical probe 10 is set so that the advancing direction of the optical signal L entering through the tip-end surface 100 approximates in parallel to the central axis of the optical waveguide of the optical probe 10. The radius of curvature R at the tip-end surface 100 is described in detail below.

The optical signal L entering the tip-end surface 100 is refracted at the refraction angle (β+ω). According to Snell's law, the relational expression as given by the following equation (1) is fulfilled by use of a refractive index nr of the core part 101 at the incident point Q at which the optical signal L enters the tip-end surface 100:

$$\sin(\alpha m+\omega)=nr\times\sin(\beta+\omega) \quad (1)$$

The following equation (2) is obtained according to the equation (1):

$$\alpha m=\sin^{-1}[nr\times\sin(\beta+\omega)]-\omega \quad (2)$$

$$\text{where } NA=\sin(\alpha m) \quad (3)$$

The following equation (4) is obtained on the presumption that the refractive index nr of the core part 101 is substantially equal to a refractive index nd of the clad part 102:

$$\beta=\sin^{-1}[\sin(\alpha 0)/nr]-\omega \quad (4)$$

where sin(α0) is a numerical aperture of the tip-end surface 100 on the assumption that the tip-end surface 100 is flat.

The advancing direction of the optical signal L entering through the tip-end surface 100 approximates in parallel to the central-axis direction when the relational expression as given by the following equation (5) is fulfilled:

$$\omega=\sin^{-1}(Ce/R) \quad (5)$$

The radius of curvature R of the tip-end surface 100 of the optical probe 10 is thus set so as to fulfill the relational expression as given by the following equation (6):

$$R=Ce/\sin(\omega) \quad (6)$$

The maximum operating distance WDm is given by the relational expression WDm=Ce/tan(αm). The operating distance WD thus fulfills the relational expression as given by the following equation (7):

$$WD \leq Ce/\tan(\alpha m) \quad (7)$$

The radius of curvature R and the clad diameter Dr of the optical probe 10 fulfill the relational expression as given by the following equation (8):

$$R \geq Dr/2 \quad (8)$$

Fulfilling the relational expression of the equation (8) can prevent the optical signal L transmitted in the optical probe 10 from leaking out of the side surface of the optical probe 10.

Figure 4:
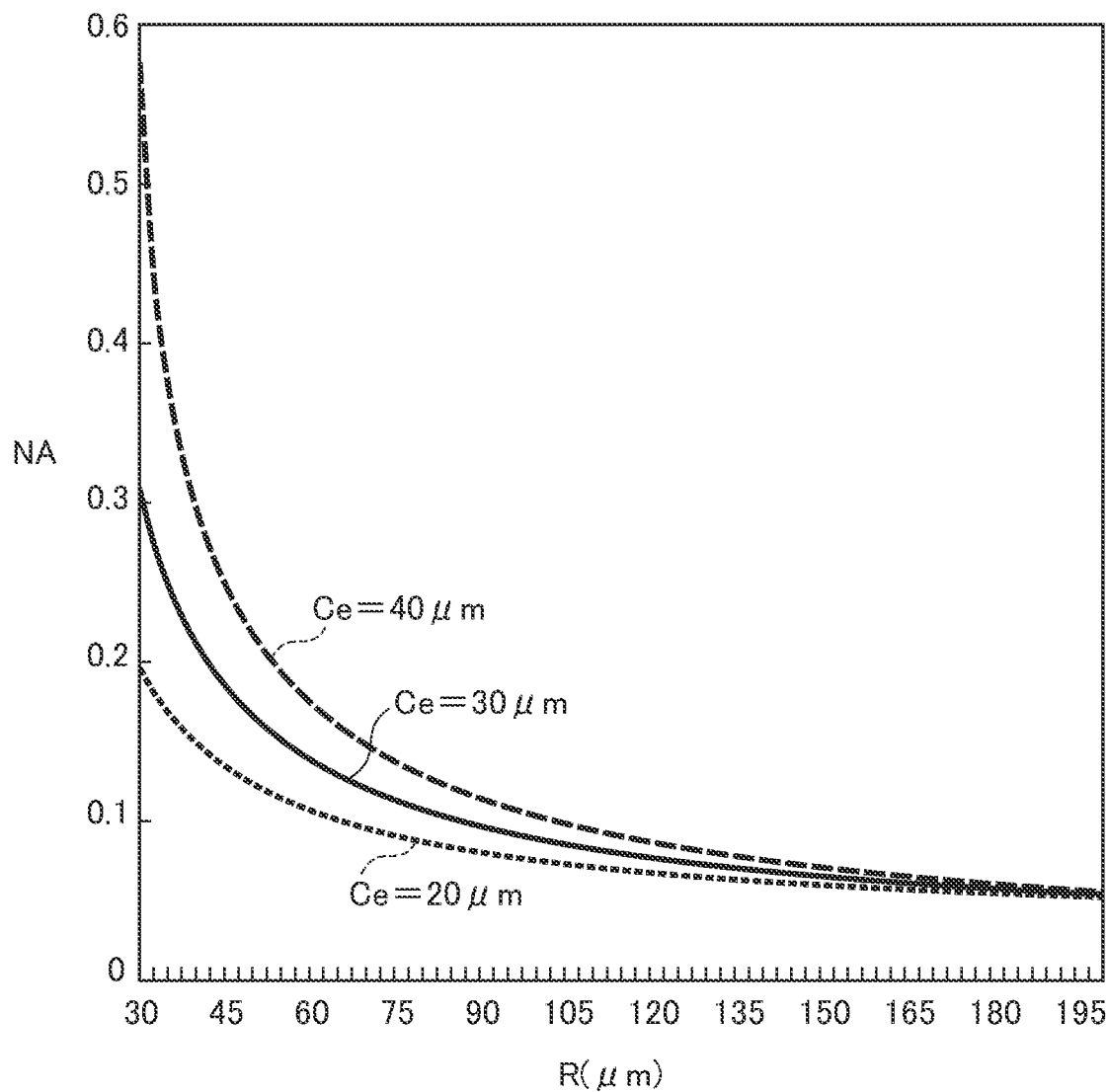
FIG. 4 is a graph showing a relationship between a radius of curvature and a numerical aperture at the tip-end surface of the optical probe.

FIG. 4 shows a relationship between the radius of curvature R and the numerical aperture NA at the tip-end surface 100 in a case in which the first MF diameter Ce of the optical probe 10 is set to each of 20 μm, 30 μm, and 40 μm. As shown in FIG. 4, the numerical aperture NA is greater as the radius of curvature R is smaller. In addition, the numerical aperture NA is greater as the first MF diameter Ce is greater. To obtain 0.2 of the numerical aperture NA at the tip-end surface 100, for example, the radius of curvature R is set as follows: the radius of curvature R is set to about 30 μm when the first MF diameter Ce is 20 μm, the radius of curvature R is set to about 40 μm when the first MF diameter Ce is 30 and the radius of curvature R is set to about 55 μm when the first MF diameter Ce is 40 μm.

Figure 5:
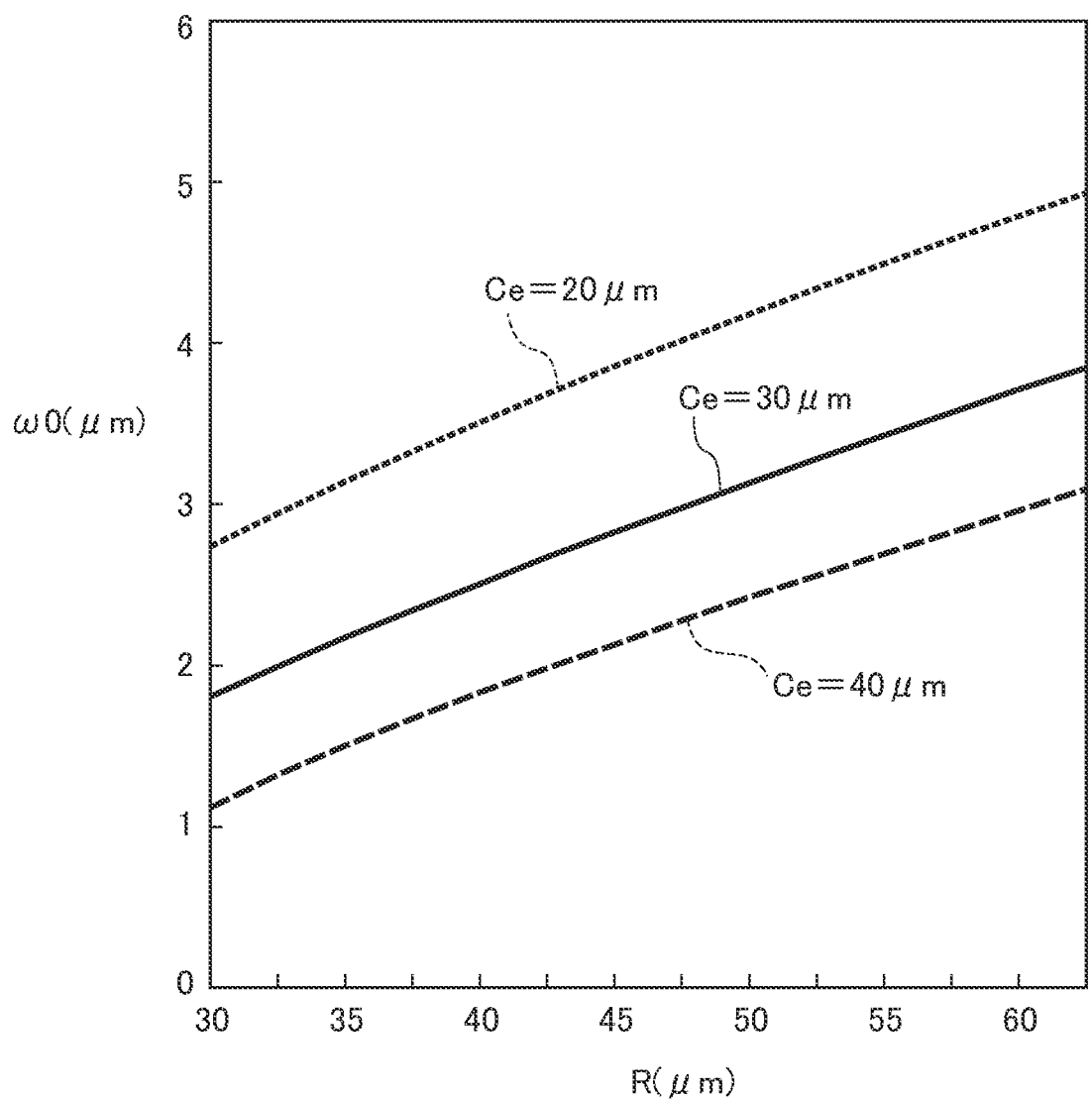
FIG. 5 is a graph showing a relationship between the radius of curvature at the tip-end surface of the optical probe and a spot radius of an optical signal.

FIG. 5 shows a relationship between the radius of curvature R at the tip-end surface 100 of the optical probe 10 and a spot radius ω0 of the optical signal L passing through the tip-end surface 100. As shown in FIG. 5, the spot radius ω0 is smaller as the radius of curvature R is smaller. In addition, the spot radius ω0 is smaller as the first MF diameter Ce of the optical probe 10 is greater in the case in which the first MF diameter Ce is set to each of 20 μm, 30 μm, and 40 μm. To optically connect the optical device 20 and the optical probe 10 efficiently, the spot diameter is set to be substantially equal to the size of the optical signal terminal. In particular, when the size of the optical signal terminal of the optical device 20 is 4 μm, for example, the spot radius ω0 is set to 2 μm. In this case, the radius of curvature R is set to about 30 μm when the first MF diameter Ce is 30 μm, and the radius of curvature R is set to about 45 μm when the first MF diameter Ce is 40 μm.

Figure 6:
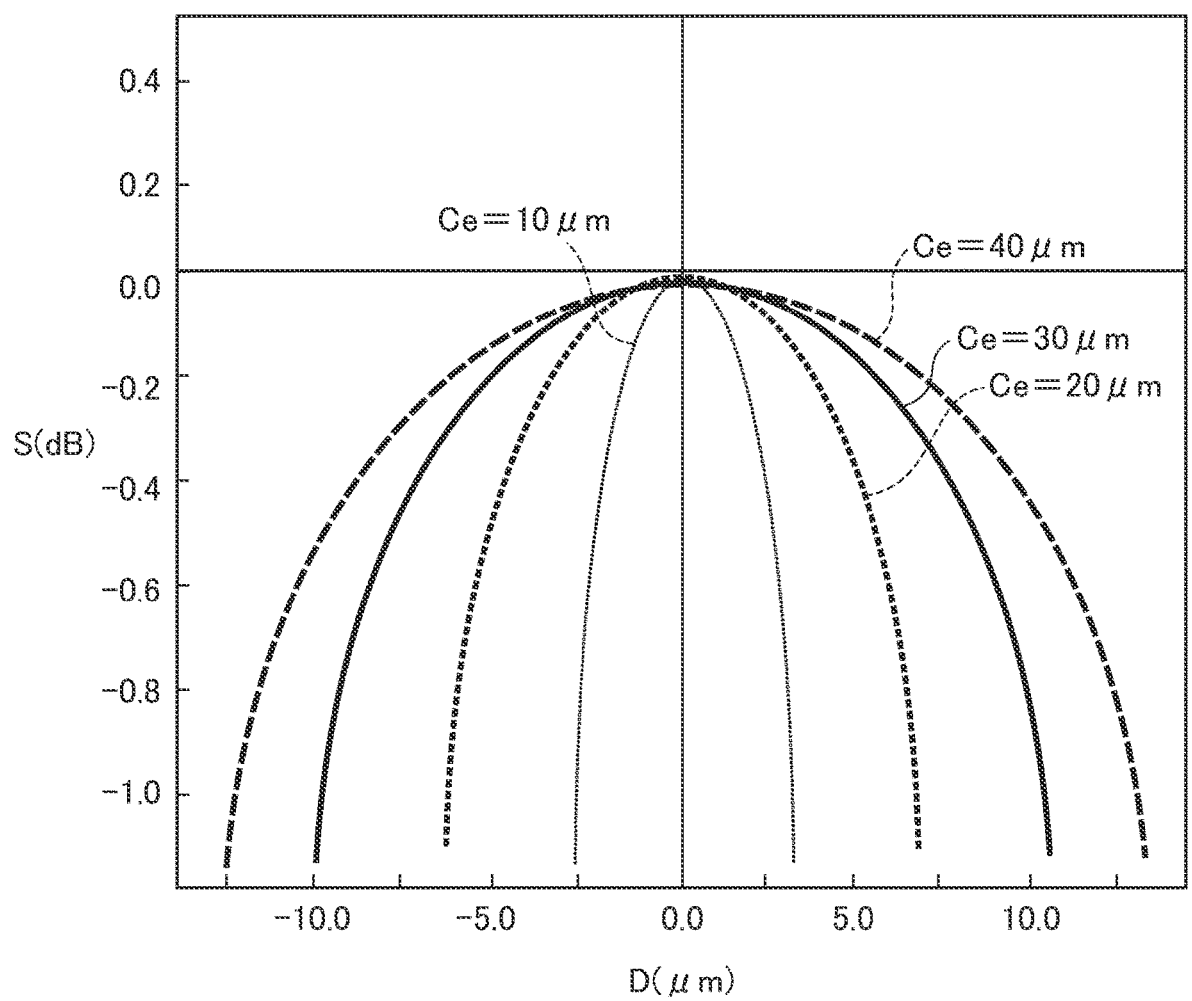
FIG. 6 is a graph showing a relationship between a positional deviation and a connection loss.

FIG. 6 shows a relationship between a positional deviation D between the central axis C10 of the optical probe 10 and an optical axis C20 of the optical signal L in the X-axis direction or the Y-axis direction and a connection loss S of the optical signal L in the case in which the first MF diameter Ce of the optical probe 10 is set to each of 20 μm, 30 μm, and 40 μm. The graph indicated by Ce=10 μm in FIG. 6 shows a connection loss in a single mode fiber having a constant mode field diameter of 10 μm. The numerical aperture NA at the tip-end surface 100 in this case is 0.17, and the operating distance WD is 25 μm.

As shown in FIG. 6, the variation in the connection loss S with respect to the positional deviation D is smaller as the first MF diameter Ce is greater. According to FIG. 6, the range of the positional deviation D for controlling the variation in the connection loss S within 0.1 dB is as follows: 2.5 μm≥D≥−2.5 μm when the first MF diameter Ce is 20 μm, 3.5 μm≥D≥−3.5 μm when the first MF diameter Ce is 30 μm, and 5.0 μm≥D≥−5.0 μm when the first MF diameter Ce is 40 μm.

An optical probe array including a plurality of optical probes 10 aligned may cause errors in the positions of the respective optical probes 10. Using, in the optical probe array, the optical probes 10 having a small variation in the connection loss with respect to the positional deviation can lead to a reduction in variation in the connection loss upon the measurement of the optical device 20 by use of the optical probe array. Namely, using the optical probes 10 with the large first Mf diameter Ce in the optical probe array can reduce the variation in the connection loss that depends on the positional deviation D. For example, the optical probes 10 with the first MF diameter CE in the range of 30 μm to 40 μm may be used to fabricate the optical probe array.

In addition, adjusting the operating distance WD can vary the range of the positional deviation D so as to reduce the variation in the connection loss S. For example, the range of the positional deviation D can be increased so as to control the variation in the connection loss S within 0.1 dB as the operating distance WD is smaller.

Figure 7:
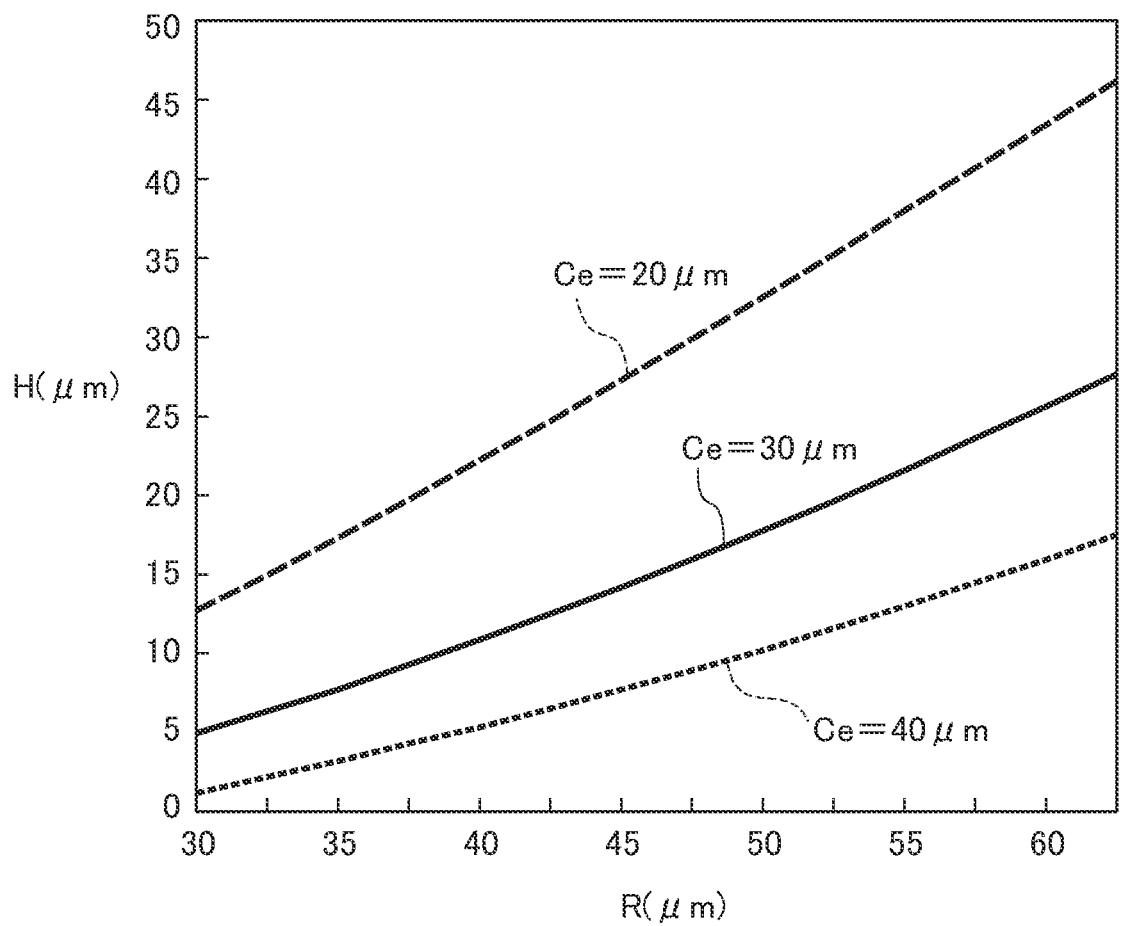
FIG. 7 is a graph showing a relationship between the radius of curvature at the tip-end surface of the optical probe and a spot length.

FIG. 7 shows a relationship between the radius of curvature R at the tip-end surface 100 of the optical probe 10 and a length of a range in which the spot radius ω0 is constant in the central-axis direction (referred to below as a "spot length H"). A depth of focus of the optical signal L is twice as long as the spot length H. As shown in FIG. 7, the spot length H is longer as the radius of curvature R is greater. In addition, the spot length H is shorter as the first MF diameter Ce is greater.

For example, the spot radius ω0 is presumed to be 2 μm when the size of the optical signal terminal of the optical device 20 is 4 μm. According to FIG. 5, the radius of curvature R is 30 μm so as to obtain 2 μm of the spot radius ω0 when the first MF diameter Ce is 30 μm. In this case, the spot length H is 5 μm according to FIG. 7, and the depth of focus is then 10 μm. The connection loss has almost no change if the operating distance is changed by about 10 μm in the Z-axis direction. The use of the optical probe 10 that fulfills the relational expression of the equation (6) thus can increase the tolerance for the positional deviation in the Z-axis direction.

The central axis C10 of the optical probe 10 is sometimes not parallel to the optical axis C20 of the optical signal L, and the central axis C10 and the optical axis C20 are then led to intersect with each other. An angle made between the central axis C10 and the optical axis C20 in this case is referred to below as a "tilt angle". An angular deviation of the incident angle of the optical signal L at the tip-end surface 100 derived from the tilt angle is also referred to below as a "rotational deviation". A variation in the characteristics of the optical signal L transmitted in the optical probe 10 (referred to below as an "incident variation") may possibly be caused due to the occurrence of the tilt angle.

In the optical probe 10, the advancing direction of the optical signal L passing through the tip-end surface 100 approximates in parallel to the central-axis direction, as described above. This avoids the incident variation derived from the occurrence of the tilt angle, so as to allow the optical signal L to stably enter the optical probe 10. Namely, the optical probe 10 has a great tolerance for the rotational deviation. The optical probe 10 thus can avoid or reduce the connection loss of the optical signal L if the central axis C10 is not parallel to the optical axis C20.

As described above, the optical probe 10 according to the first embodiment has the first region 11 with the increased mode field diameter and thus has the improved tolerance for the positional deviation in the X-axis direction and the Y-axis direction. Since the tip-end surface 100 is the curved surface that fulfills the relational expression of the equation (6), the advancing direction of the optical signal L entering the tip-end surface 100 approximates in parallel to the central axis C10 of the optical probe 10. The optical probe 10 thus can reduce the variation in loss if the operating distance WD is shifted from a predetermined distance. Namely, the tolerance for the positional deviation in the Z-axis direction is improved. The optical probe 10 also has the great tolerance for the rotational deviation derived from the tilt angle.

The optical probe 10 thus can improve the tolerance for the positional deviation and the rotational deviation in the X-Y-Z-axis directions. This can shorten the time requited for the positioning between the optical probe 10 and the optical device 20, or can eliminate the precise positioning depending on the circumstances. The use of the optical probe 10 can measure the characteristics of the optical signal L emitted from the optical device 20 stably and accurately. The optical device 20 thus can be measured efficiently by use of the optical probe 10 in which the transmission mode of the optical signal L is the single mode.

Figure 8A:
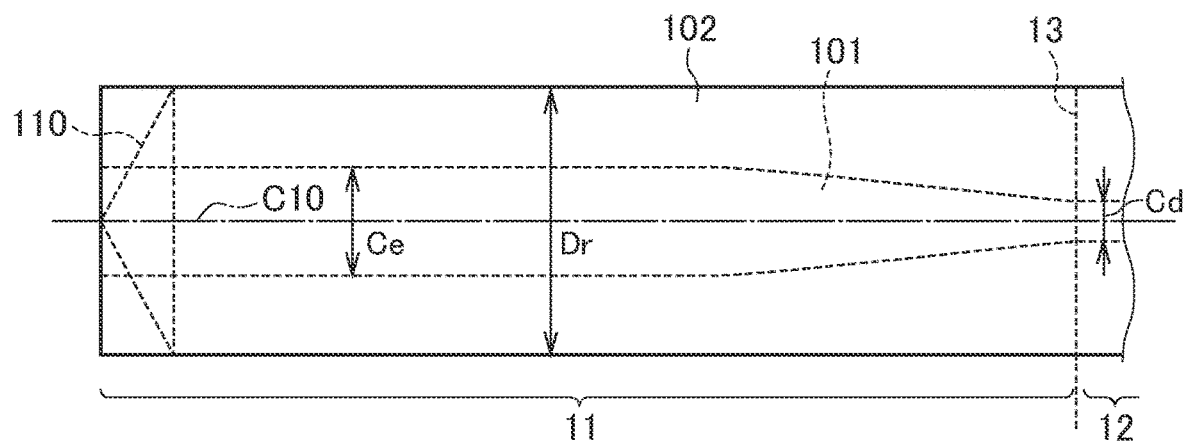
FIG. 8A is a schematic view for explaining a method of manufacturing the optical probe according to the first embodiment (Part 1).

A method of manufacturing the optical probe 10 is described below with reference to FIG. 8A and FIG. 8B. It should be understood that the manufacturing method described below is an example, and the optical probe 10 including a modified example can be manufactured by various methods other than the method described below.

First, an optical fiber having a mode field diameter gradually decreased in a tapered state from one end in the central-axis direction is prepared. For example, the first region 11 is formed in the optical fiber having the optical waveguide including the core part 101 and the clad part 102, as illustrated in FIG. 8A. The method of forming the first region 11 used herein may be a method of locally heating the core part 101. For example, one end of the single mode fiber having the clad diameter Dr and the mode field diameter that is the second MF diameter Cd is heated to about 1200 to 1400° C. The heating step diffuses an additive present which increases the refractive index in the core part 101, and leads the core part 101 to expand in the radial direction. The first region 11 is thus formed in which the mode field diameter on the tip-end surface is the first MF diameter Ce. The additive to be diffused is germanium (Ge), for example.

The end part of the first region 11 is fixed to a fixing jig and the like and is ground into a circular cone shape with an edge polisher or a precision grinder, for example. This process forms a circular cone region 110 indicated by the broken line in FIG. 8A.

Figure 8B:
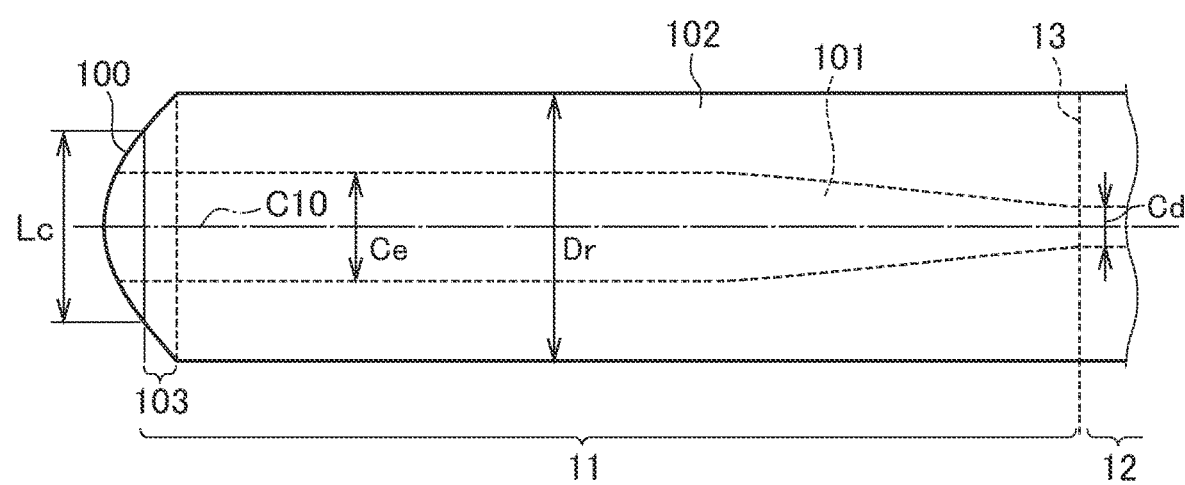
FIG. 8B is a schematic view for explaining the method of manufacturing the optical probe according to the first embodiment (Part 2).

The surface of the circular cone region 110 is then processed about the top of the circular cone as an axis into a convex surface by heat molding using electrodischarge machining or by precision grinding, for example, so as to form the tip-end surface 100 as illustrated in FIG. 8B. At this point, the region with the diameter Lc about the central axis C10 may be processed into a curved surface, so as to lead an outer circumferential region 103 on the outside of the region processed into the curved surface to be tapered, as illustrated in FIG. 8B.

In the step of processing the surface of the circular cone region 110 into the convex surface described above, the tip-end surface 100 is formed such that the radius of curvature R of the tip-end surface 100 fulfils the relational expression of the equation (6). This step leads the advancing direction of the optical signal L entering from the tip-end surface 100 approximates in parallel to the central-axis direction of the optical waveguide of the optical probe 10. The manufacture of the optical probe 10 is thus completed.

The step of processing the surface of the circular cone region 110 into the curved surface may employ a method of thermal fusion using high-frequency discharge or carbon dioxide ($CO_2$) laser, or a method of precision grinding with a grinder, for example. The surface of the circular cone region 110 may be processed into the curved surface by thermal fusion after the grinding processing. The use of the method of the thermal fusion after the grinding processing improves the roughness of the surface caused by the grinding processing, so as to reduce the connection loss caused by the surface diffusion of the optical signal L on the tip-end surface 100.

For example, the core diameter of the first region 11 may be set to about 25 μm, and the first MF dimeter Ce may be set to about 30 μm. The core diameter of the second region 12 may be set to about 8 μm, and the second MF dimeter Cd may be set to about 10 μm.

The use of the optical probe array including the plural optical probes 10 arranged for measuring the optical devices 20 can simultaneously align a plurality of optical signal terminals with the corresponding optical probes 10. The characteristics of the optical devices 20 thus can be measured for a short period of time with the optical probe array. In other words, the multicore connection between the optical probes 10 and the optical signal terminals by the optical probe array can greatly shorten the time required for the positioning, as compared with a measurement method that aligns one optical probe 10 with one optical signal terminal at a time.

The optical probe array, when fabricated by the plural optical probes 10 arranged, may cause errors in the positions of the respective optical probes 10. The optical probe 10 according to the present embodiment has the great tolerance for the positional deviation and the rotational deviation in the X-Y-Z-axis directions, as described above. The optical probe array including the optical probes 10 thus can reduce the incident variation of the optical signal L if the relative position between the optical probe 10 and the optical device 20 is displaced or if the central axis C10 and the optical axis C20 make a tilt angle to intersect with each other. The use of the optical probe array fabricated by the optical probes 10 can facilitate the alignment between the respective optical probes 10 and the respective optical signal terminals of the optical devices 20 formed on the wafer within the range in which the incident variation is reduced.

Namely, the use of the optical probe array including the optical probes 10 can shorten the measurement time by simultaneously aligning the plural optical devices 20 to be measured and also reduce the connection. This facilitates the measurement evaluation of the optical devices 20, so as to enhance the productivity due to the improvement in yield accordingly.

Figure 9A:
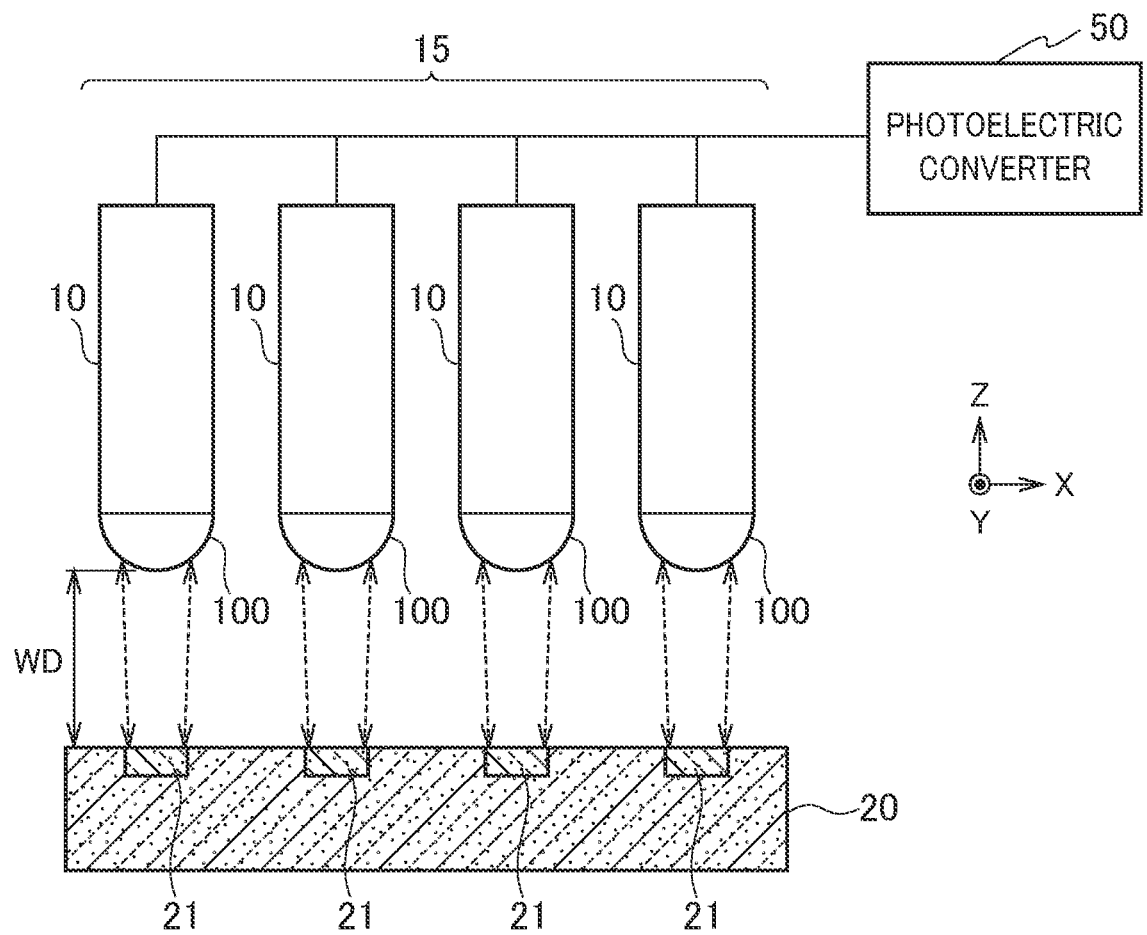
FIG. 9A is a schematic view illustrating a configuration of an optical probe array according to the first embodiment.

FIG. 9A illustrates the optical probe array including the optical probes 10. While FIG. 9A illustrates the optical probe array 15 including the four optical probes 10 aligned, the number of the optical probes 10 included in the optical probe array is not limited to four.

Figure 9B:
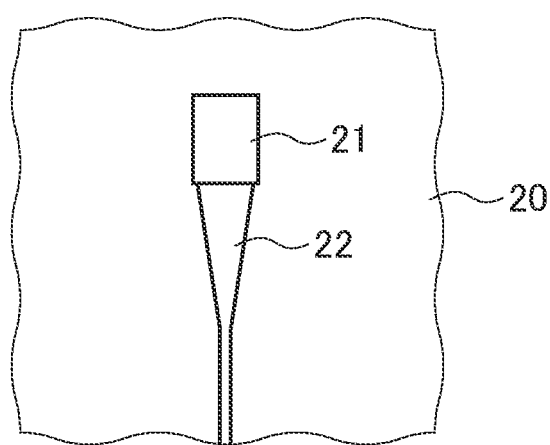
FIG. 9B is a schematic plan view showing an example of an optical waveguide of the optical device.

The optical device 20 illustrated in FIG. 9A has a configuration in which the optical signal terminals 21 having input-output ends implemented by diffraction gratings are arranged at regular intervals. An optical input signal output from the tip-end surface 100 of the respective optical probes 10 enters the respective optical signal terminals 21 separated from the tip-end surface 100 of the respective optical probes 10 by the operating distance WD. The optical input signal entering the respective optical signal terminals 21 is deflected by the diffraction gratings of the input-output ends, so as to be transmitted through the optical waveguides (not illustrated) formed in the optical device 20. The optical input signal is then transmitted to functional components such as a light receiving element, an optical switch, and a modulation element arranged inside the optical device 20. For example, as illustrated in FIG. 9B, the optical waveguide 22 for transmitting the optical signal to the respective functional components of the optical device 20 via the optical signal terminal 21 is configured such that the mode field diameter is gradually decreased in a tapered state.

An optical output signal deflected to be output from the diffraction gratings of the respective optical signal terminals 21 of the optical devices 20 enters the tip-end surface 100 of the respective optical probes 10. The optical output signal transmitted through the inside of the respective optical probes 10 then enters a photoelectric converter 50. The photoelectric converter 50 convers the optical output signal to an electrical signal and amplifies it.

The optical probes 10 included in the optical probe array 15 each have the tip-end surface 100 that has the expanded mode field diameter and is the curved surface having the radius of curvature R. The variation in loss is thus small if the positional deviation or the rotational deviation in the X-Y-X-axis directions is caused between the optical probes 10 and the optical signal terminals 21. The use of the optical probe array 15 thus enables the stable and highly-accurate measurement and the short-time processing. The deviation of the tolerance for controlling the variation in loss within a predetermined tolerance range can be adjusted in accordance with the setting of the operating distance WD. The deviation of the tolerance can be increased in accordance with the setting of the operating distance WD within a range fulfilling a relational expression as given by $WD \leq WDm = Ce/\tan(\alpha m)$.

While FIG. 9A illustrates the case of the optical array 15 including the optical probes 10 arranged in line, the optical probe array 15 may have any other configuration. For example, the optical probe array 15 may be configured such that the optical probes 10 are arranged in both the X-axis direction and the Y-axis direction so as to be arrayed in lines.

Figure 10:
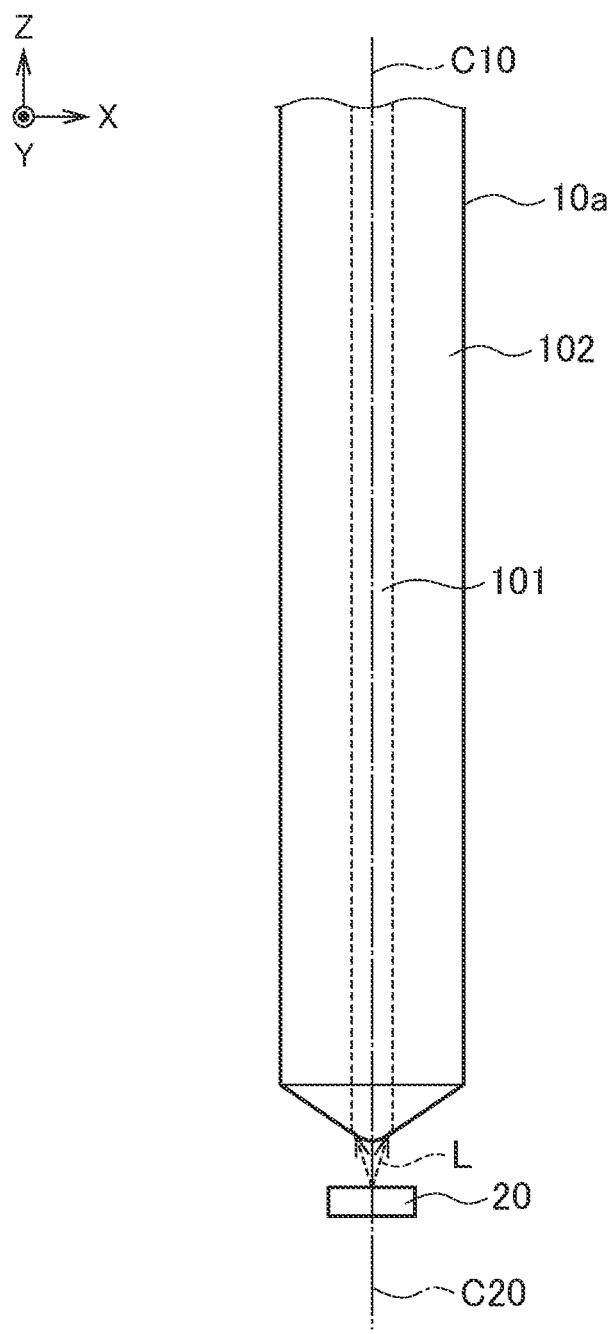
FIG. 10 is a schematic view illustrating a configuration of an optical fiber of a comparative example.

When the optical device 20 is measured by use of an optical fiber 10a of a single mode fiber in which the mode field diameter is not expanded on the tip-end surface, as compared with the measurement by use of the optical probe 10, the following problems would be presumed as illustrated with a comparative example in FIG. 10. The optical fiber 10a has the mode field diameter that is constant in the central-axis direction from the end part formed into a circular cone shape. The measurement of the optical device 20 by use of the optical fiber 10a needs to align the optical fiber 10a with the optical device 20 by the positional adjustment in the respective X-Y-Z-axis directions and the submicron-order precision control with six degrees of freedom of rotational fine adjustments in the respective axes. When the plural optical fibers 10a are aligned to fabricate the optical probe array, it is difficult to precisely position the respective optical fibers 10a to simultaneously measure the plural optical devices 20. It requires a lot of time and work when the optical fibers 10a are used for measuring the plural optical devices 20 formed on a wafer. The evaluation measurement of the optical devices 20 by use of the optical fibers 10a has low productivity and impedes a shift to mass production.

In contrast, the optical probe 10 has the large tolerance in the positioning in the X-Y-Z-axis directions and the positioning by the rotation about the X axis and the Y axis for adjusting the tilt angle. The use of the optical probes 10 in the optical probe array thus can simplify the configuration and reduce the time for aligning the optical probe array with the optical devices 20, and can reduce the variation in loss accordingly.

Figure 11:
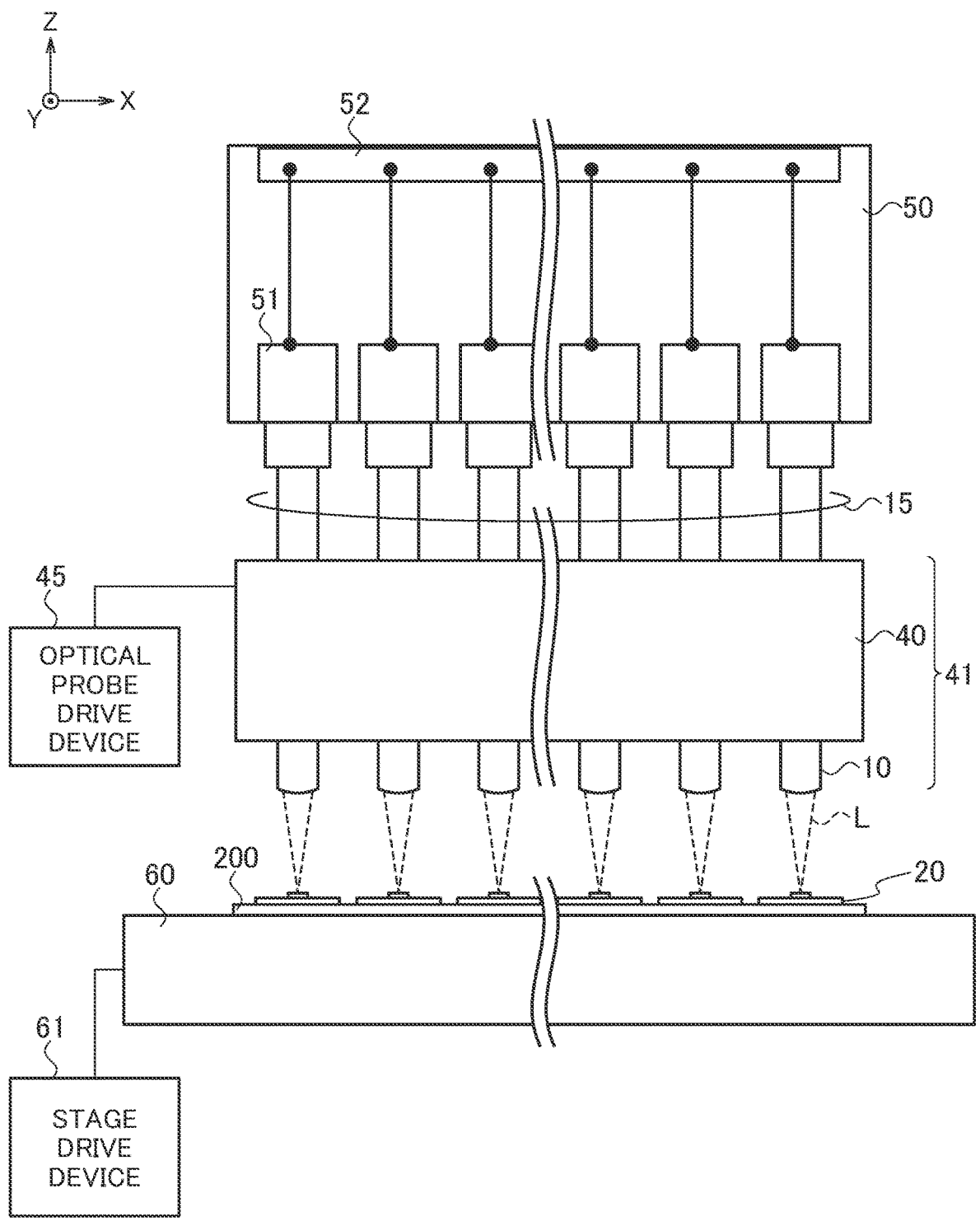
FIG. 11 is a schematic view illustrating a configuration of a measurement system using the optical probes according to the first embodiment.

FIG. 11 illustrates a configurational example of a measurement system by use of the optical devices 10. The measurement system illustrated in FIG. 11 includes an optical probe head 40 holding the optical probes 10. The optical probe head 40 holds the optical probe array 15 in which the optical probes 10 are arrayed in lines. Although not illustrated, the optical probes 10 are arranged at regular intervals in both the X-axis direction and the Y-axis direction in the optical probe array 15.

The measurement system illustrated in FIG. 11 is used for the measurement of the plural optical devices 20 arrayed in lines in a wafer 200 mounted on a stage 60. The positions of the respective optical probes 10 arranged in the optical probe array 15 correspond to the positions of the respective optical devices 20 formed on the wafer 200.

The optical probe head 40 is controlled by an optical probe drive device 45 so as to move in the Z-axis direction. This enables the fine adjustment of the distance between the tip-end surfaces 100 of the optical probes 10 and the optical devices 20 in the Z-axis direction. The alignment between the optical probe head 40 and the optical devices 20 in the X-axis direction and the Y-axis direction can be made such that the stage 60 is moved by a stage drive device 61. The stage 60 is rotated about the Z-axis direction by the stage drive device 61, so as to adjust the position of the respective optical devices 20 with respect to the optical probes 10 in the rotating direction about the Z-axis direction as a central axis (referred to below as a "Z-axis rotating direction"). The optical probe head 40 may be moved in each of the X-axis direction, the Y-axis direction, and the Z-axis direction while the position of the stage 60 is fixed.

As described above, the alignment between the optical probes 10 and the optical devices 20 can be made by the measurement system as illustrated in FIG. 11. Alternatively, a method may be employed in which the stage 60 is moved in the X-axis direction, the Y-axis direction, and the Z-axis direction or in the rotating directions about the X axis and the Y axis while the position of the optical probe head 40 is fixed. Various kinds of adjusting methods thus can be employed for the alignment between the optical probes 10 and the optical devices 20.

After the alignment between the optical probes 10 and the optical devices 20, the optical signals are transmitted via the measurement system as illustrated in FIG. 11 so as to measure the optical devices 20. For example, the optical signals L emitted from the optical devices 20 are received by the optical probes 10.

The optical probes 10 are connected to the photoelectric converter 50 including photoelectric conversion modules 51 and an electrical connecting terminal 52. The optical signals L emitted from the optical devices 20 are transmitted via the optical probes 10 to the photoelectric conversion modules 51 optically connected to the optical probes 10. The photoelectric conversion modules 51 convert the optical signals L into electrical signals, and outputs the converted electrical signals to the electrical connection terminal 52. The electrical connection terminal 52 is electrically connected to a tester (not illustrated). The photoelectric converter 50 sends the electrical signals photoelectrically converted from the optical signals L to the tester via the electrical connection terminal 52.

Examples of the photoelectric conversion modules 51 as used herein include a type of converting the optical signals L into the electrical signals by a photodetector and the like, and a type of dispersing the optical signals L by a diffraction grating device to detect a variation in wavelength based on the diffraction angle direction. The type of the photoelectric conversion modules 51 used is determined as appropriate depending on the measurement purpose. Alternatively, the optical signals L may be branched in front of the photoelectric conversion modules 51, so as to simultaneously execute various kinds of measurement. Photoelectrically converting the output from the optical probes 10 adjacent to the optical probe head 40 by the photoelectric converter 50 can simplify the measurement system, accelerate the measurement time, and improve repeated reproducibility of measurement values. The measurement of the optical device 20 as described above can be made by use of an optical probe card 41 including the optical probes 10 and the optical probe head 40 holding the optical probes 10.

Modified Example

Figure 12:
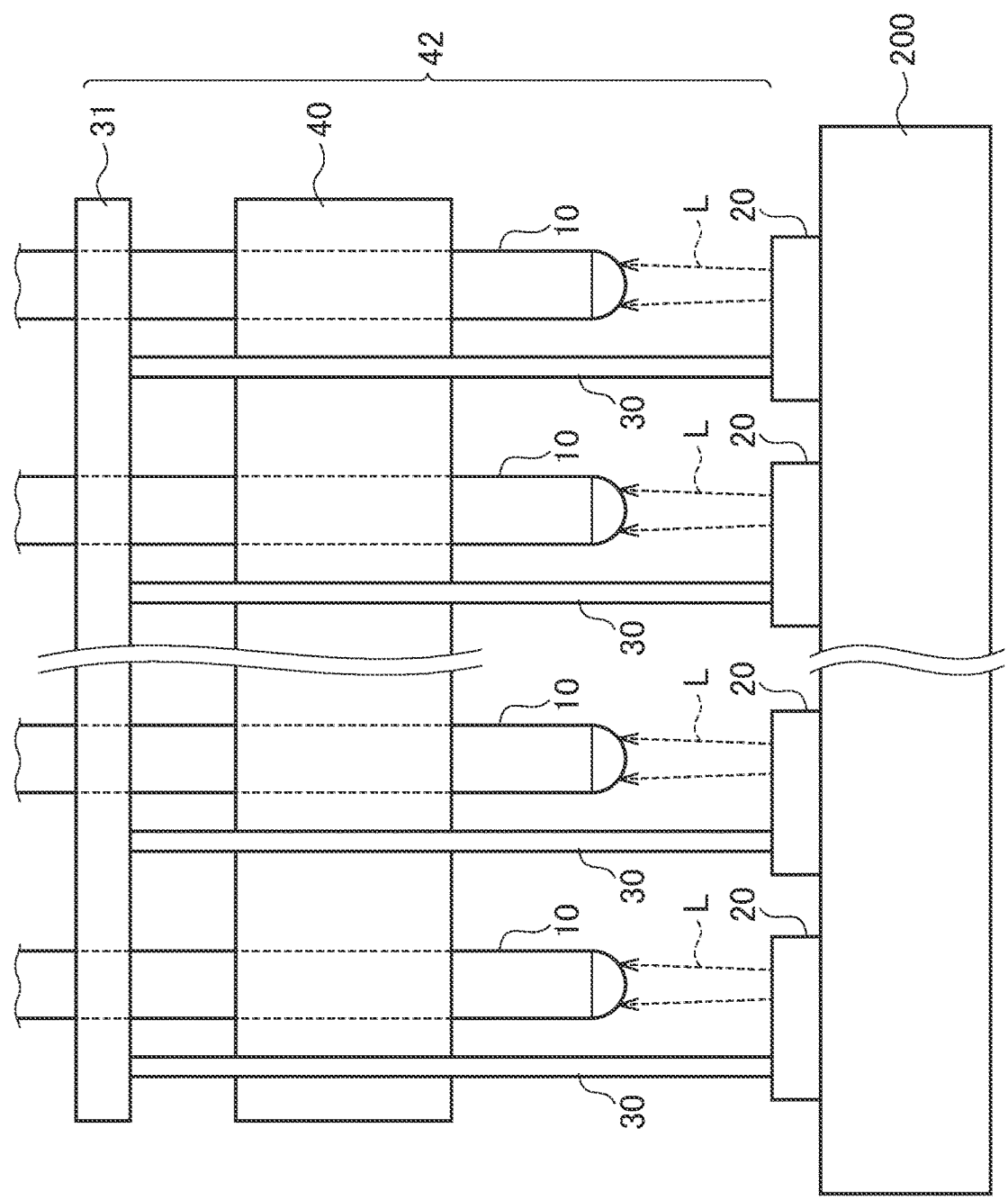
FIG. 12 is a schematic view illustrating a configuration of a measurement system according to a modified example of the first embodiment.

To measure the characteristics of the optical devices 20 formed in the wafer through which the electric signals and the optical signals are transferred, the optical probes 10 may be combined with electrical probes 30 through which the electrical signals are transmitted as illustrated in FIG. 12. Examples of the electrical probes 30 as used herein include a cantilever type, a vertical needle type, and a vertical spring type. The electrical probes 30 are held by an electrical probe head 31.

For example, a probe unit including a pair of the optical probe 10 and the electrical probe 30 is configured for each optical device 20. The probe unit is arranged to correspond to the position of the optical device 20 formed in the wafer 200. FIG. 12 illustrates the case in which each probe unit includes the single optical probe 10 and the single electrical probe 30. The number of the optical probes 10 and the electrical probes 30 included in the respective probe units is determined as appropriate depending on the configuration of the optical devices 20 and the measurement contents.

FIG. 12 illustrates the case of measuring the optical devices 20 by use of a composite probe card 42. The composite probe card 42 includes the optical probes 10, the optical probe head 40, the electrical probes 30, and the electrical probe head 31. For example, the optical devices 20 are measured by use of the probe units as follows. The electrical signals output from the tester (not illustrated) are applied to electrical signal terminals of the optical devices 20 via the electrical probes 30. The optical signals L emitted from the optical signal terminals of the optical devices 20 are received by the optical probes 10. The use of the composite probe card 42 including the plural probe units enables a multicore connection between the optical probes 10 and the optical signal terminals of the optical devices 20, so as to measure the characteristics of the respective optical devices 20 with the single positioning. The use of the composite probe card 42 also allows the optical signals emitted from the optical probes 10 to enter incident ends of the optical devices 20, and allows the optical signals to be photoelectrically converted by the optical devices 20, so as to measure the photoelectrically converted electrical signals via the electrical probes 30. This configuration improves the efficiency of the measurement of the optical devices 20.

The measurement of the optical devices 20 by use of the composite probe card 42 also has the large tolerance for the positional deviation and the rotational deviation in the X-Y-Z-axis directions due to the use of the optical probes 10. The measurement by use of the composite probe card 42 can obtain stable input-output characteristics regarding the optical signals L emitted from the respective optical devices 20. In addition, both the optical signals and the electrical signals are sent and received between the tester and the respective optical devices 20, so as to measure the light receiving characteristics, switching characteristics, and oscillation characteristics of the optical devices 20 simultaneously.

Second Embodiment

Figure 13:
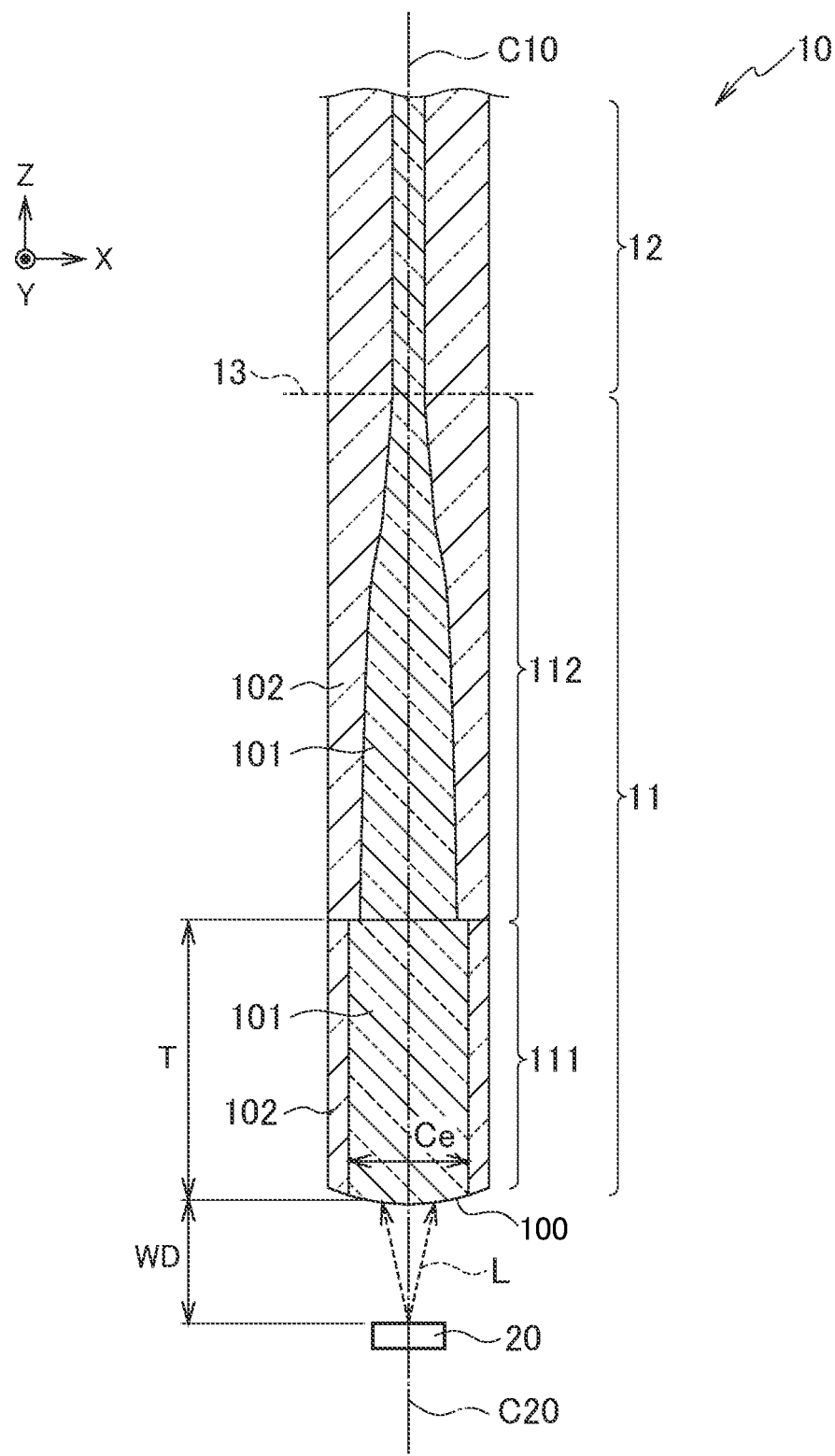
FIG. 13 is a schematic view illustrating a configuration of an optical probe according to a second embodiment.

The optical probe 10 according to a second embodiment includes the first region 11 having a configuration in which a tip-end part 111 connected to the tip-end surface 100 is joined to a connection part 112 connected to the second region 12, as illustrated in FIG. 13. The tip-end part 111 and the connection part 112 have the common central axis C10. The tip-end part 111 has a constant mode field diameter of the first MF diameter Ce. The connection part 112 has a mode field diameter smaller than or equal to the mode field diameter of the tip-end part 111 at the joined surface between the tip-end part 111 and the connection part 112. The connection part 112 includes a region in which the mode field diameter is gradually decreased in the central-axis direction of the optical waveguide from the joined surface with the tip-end part 111.

For example, the tip-end part 111 as used herein is a graded-index (GI) optical fiber in which a first tip-end surface as the tip-end surface 100 is processed into a curved surface having a radius of curvature R. A second tip-end surface of the tip-end part 111 is fused and connected to a tip-end surface of the connection part 112 with the core part 101 expanded. The connection part 112 as used herein is an optical fiber, for example.

A length T of the tip-end part 111 in the central-axis direction is determined such that the optical signal L entering through the tip-end surface 100 passes through the joined surface between the tip-end part 111 and the connection part 112 in parallel to the central-axis direction.

For example, when the GI optical fiber is used for the tip-end part 111, the length T of the tip-end part 111 is set to a pitch length at which the optical signal L can enter most. The pitch length corresponds to a period ($2\pi$) of an in-lens optical path length. When the pitch length P is presumed to be 0.25, the length T is given by: $T=2\pi p/\sqrt{A}$ ($\sqrt{A}$: a refractive index distributed constant of the GI optical fiber). The optical signal L advances through the tip-end part 111 substantially parallel to the central-axis direction and then enters the joined surface between the tip-end part 111 and the connection part 112 as a parallel light parallel to the central-axis direction.

The optical probe 10 according to the second embodiment, which has the configuration in which the GI optical fiber having the tip-end surface 100 is joined to the optical fiber with the core part 101 expanded, can extend the operating distance WD so as to expand the incident range of the optical signal L at the tip-end surface 100. The other configurations of the second embodiment are the same as those of the first embodiment, and overlapping explanations are not repeated below.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

While the respective embodiments are illustrated above with the case of using the single mode fiber for the optical probe 10, the optical fiber used for the optical probe 10 is not limited to the single mode fiber. For example, a polarization maintaining fiber, a dispersion shifted fiber, or a photonic crystal fiber may be used for the optical probe 10. The optical probe 10 may have an optical waveguide structure in which the core part is formed in a substrate. The use of the multicore optical probe array including the optical probes 10 each having an optical waveguide and a fine electric wiring pattern formed in or on the substrate and the electrical probe array similar to the optical probe array can integrate the photoelectric converters. This configuration can enable the reduction in size and the integration of the entire measurement system, and allow the optical probes 10 and the electrical probes 30 to be integrally formed on the substrate with respect to the optical devices 20 in the wafer 200. The respective embodiments thus contribute to the small measurement configuration that can eliminate or decrease the positional adjustment.

Figure 14:
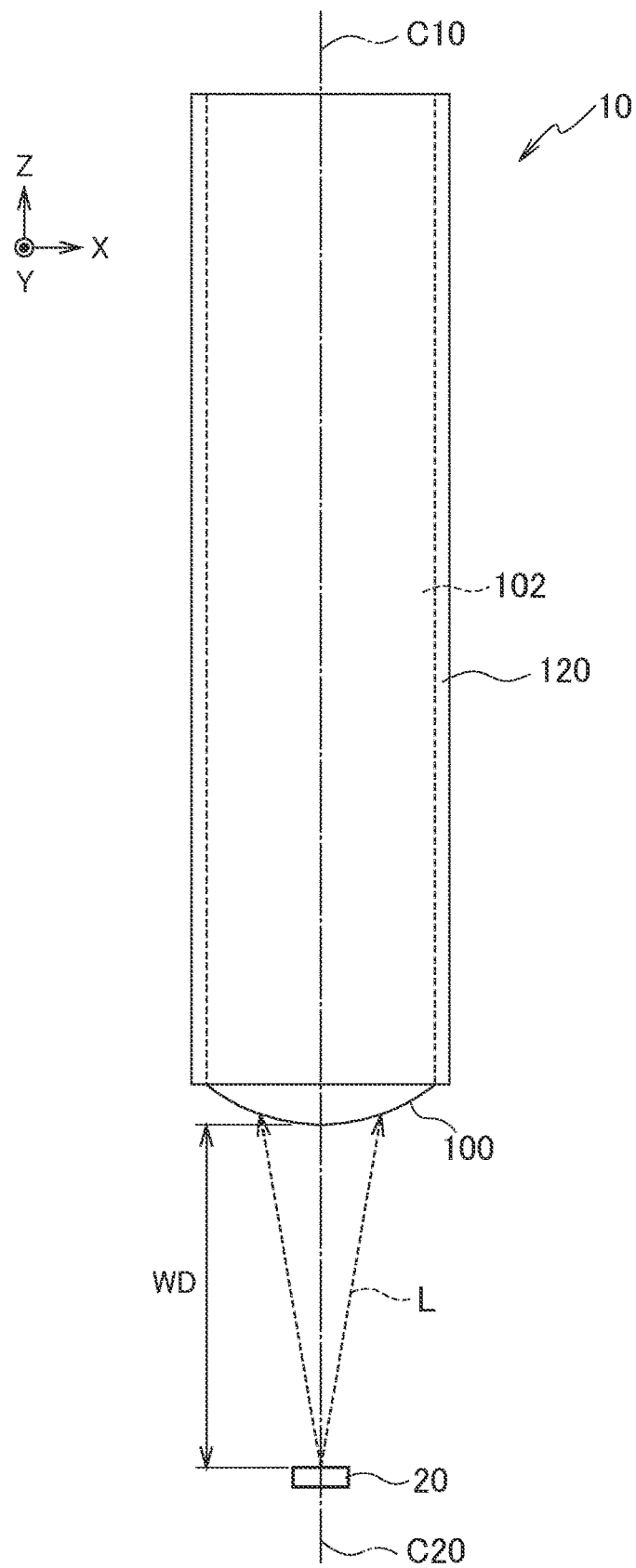
FIG. 14 is a schematic view illustrating a configuration of an optical probe according to another embodiment.

As illustrated in FIG. 14, the surface of the clad part 102 may be covered with a resin film 120. Covering the outside of the optical probe 10 with the resin film 120 improves the mechanical strength of the optical probe 10. The use of the resin film 120 covering the outside of the optical probe 10 can also prevent the entrance and adsorption of moisture to the probe 10. This can avoid a deterioration of material of the optical probe 10 due to the entrance of moisture to prevent an increase in connection loss accordingly. The resin film 120 is a polyimide film having a thickness of several micrometers, for example.

As described above, it is natural that the present invention incorporates a variety of embodiments which are not described herein.

What is claimed is:

1. An optical probe communicating an optical signal with an optical device, the optical probe comprising:
    a first region; and
    a second region connected to have a continuous optical waveguide in which a transmission mode is a single mode, the optical waveguide including a core part and a clad part arranged at a circumference of the core part;
    wherein the first region connected to a tip-end surface opposed to the optical device includes a region in which a mode field diameter that is maximum at the tip-end surface is gradually decreased toward a boundary between the first region and the second region;
    wherein the tip-end surface is a curved surface and has a radius of curvature set so that an advancing direction of the optical signal entering through the tip-end surface approximates in parallel to a central-axis direction of the optical waveguide; and
    wherein the radius of curvature R at the tip-end surface, a numerical aperture NA at the tip-end surface, a first MF diameter Ce that is the mode field diameter at the tip-end surface, a radiation angle 2αm of the optical signal entering the tip-end surface, a refractive index nr of the core part at an incident point at which the optical signal enters the tip-end surface, a central semi-angle ω at the incident point of the tip-end surface, a refraction angle (β+ω) of the optical signal at the incident point, and a numerical aperture sin(α0) at the tip-end surface on an assumption that the tip-end surface is flat fulfil the following relational expressions:

$R = Ce/\sin(\omega)$;

$NA = \sin(\alpha m)$;

$\alpha m = \sin^{-1}[nr \times \sin(\beta+\omega)] - \omega$; and $\beta = \sin^{-1}[\sin(\alpha 0)/nr]$.

2. The optical probe according to claim 1, wherein the first region has the same mode field diameter as the second region at the boundary.

3. The optical probe according to claim 1, wherein an operating distance WD between the optical device and the tip-end surface, the first MF diameter Ce that is the mode field diameter at the tip-end surface, and the radiation angle 2αm of the optical signal entering the tip-end surface fulfil a relational expression as given by $WD \leq Ce/\tan(\alpha m)$.

4. The optical probe according to claim 1, wherein the radius of curvature R at the tip-end surface and a clad diameter Dr of the optical probe fulfil a relational expression as given by $R \geq Dr/2$.

5. The optical probe according to claim 1, wherein a surface of the clad part is covered with a resin film.

6. The optical probe according to claim 1, wherein:
    the first region has a configuration in which a tip-end part connected to the tip-end surface is joined to a connection part connected to the second region;
    a mode field diameter of the tip-end part is constant;
    a mode field diameter of the connection part is smaller than or equal to the mode field diameter of the tip-end part at a joined surface between the tip-end part and the connection part, and the connection part includes a region in which the mode field diameter is gradually decreased from the joined surface in the central-axis direction; and
    a length of the tip-end part in the central-axis direction is set such that the optical signal entering the tip-end surface passes through the joined surface in parallel to the central-axis direction.

7. An optical probe array comprising a plurality of the optical probes according to claim 1 to be arranged.

8. An optical probe card comprising:
    the optical probe according to claim 1; and
    an optical probe head holding the optical probe.

9. A method of manufacturing an optical probe having an optical waveguide in which a transmission mode is a single mode, the optical waveguide including a core part and a clad part arranged at a circumference of the core part, the method comprising:
    preparing an optical fiber including a region in which a mode field diameter is gradually decreased from one end in a central-axis direction;
    grinding the one end into a circular cone shape to form a circular cone region; and
    processing a tip-end surface of the circular cone region into a convex surface about a top of the circular cone shape as an axis;
    wherein a radius of curvature of the tip-end surface is set so that an advancing direction of an optical signal entering through the tip-end surface approximates in parallel to the central-axis direction of the optical waveguide; and
    wherein the radius of curvature R at the tip-end surface, a numerical aperture NA at the tip-end surface, a first MF diameter Ce that is the mode field diameter at the tip-end surface, a radiation angle 2αm of the optical signal entering the tip-end surface, a refractive index nr of the core part at an incident point at which the optical signal enters the tip-end surface, a central semi-angle ω at the incident point of the tip-end surface, a refraction angle (β+ω) of the optical signal at the incident point, and a numerical aperture sin(α0) at the tip-end surface on an assumption that the tip-end surface is flat fulfil the following relational expressions:

$R = Ce/\sin(\omega)$;

$NA = \sin(\alpha m)$;

$\alpha m = \sin^{-1}[nr \times \sin(\beta+\omega)] - \omega$; and $\beta = \sin^{-1}[\sin(\alpha 0)/nr]$.

\* \* \* \* \*